(12) United States Patent
Chen et al.

(10) Patent No.: US 7,255,605 B2
(45) Date of Patent: Aug. 14, 2007

(54) SURFACE CONTACT CARD HOLDER

(75) Inventors: Rui-Hao Chen, Shenzhen (CN);
Zhong-Shu Qin, Shenzhen (CN);
Hsiao-Hua Tu, Tu-Cheng (TW);
Chia-Hua Chen, Tu-Cheng (TW)

(73) Assignees: ShenZhen FuTaiHong Precision Industrial Co., Ltd., Shenzhen, Guangdong Province (CN); Sutech Trading Limited, Tortola (VG)

( * ) Notice: Subject to any disclaimer, the term of this patent is extended or adjusted under 35 U.S.C. 154(b) by 0 days.

(21) Appl. No.: 11/398,024

(22) Filed: Apr. 4, 2006

(65) Prior Publication Data
US 2007/0001698 A1 Jan. 4, 2007

(30) Foreign Application Priority Data
Jul. 1, 2005 (CN) .................... 2005 1 0035749

(51) Int. Cl.
*H01R 24/00* (2006.01)
(52) U.S. Cl. .................. 439/630; 439/331
(58) Field of Classification Search ........ 439/630, 439/331, 326
See application file for complete search history.

(56) References Cited

U.S. PATENT DOCUMENTS 4,548,452 A * 10/1985 Gillett .................. 439/60

* cited by examiner

*Primary Examiner*—Javaid H. Nasri
(74) *Attorney, Agent, or Firm*—Jeffrey T. Knapp

(57) ABSTRACT

A surface contact card holder (200) for an electronic device includes a latching portion (30) and an elastic frame (40). The electronic device has a device body (10) with a receiving groove (20) defined therein for receiving a surface contact card (50) therein and the receiving groove has a card entrance (1002). The latching portion (30) is located adjacent to the card entrance of the receiving groove and the elastic frame is configured for attaching to the device body. The elastic frame has a first frame end (402) located adjacent to the card entrance, and an opposite second frame end (4013). The second frame end has a pressing portion configured for pressing the surface card against the body. The first frame end and the latching portion are configured for sandwiching the surface card therebetween.

20 Claims, 5 Drawing Sheets

SURFACE CONTACT CARD HOLDER

BACKGROUND OF THE INVENTION

1. Field of the Invention

The present invention generally relates to surface contact card holder for holding a surface contact card in a portable electronic device.

2. Discussion of the Related Art

With the development of wireless communication and information processing technologies, portable electronic devices such as mobile phones are now in widespread use. These electronic devices enable consumers to enjoy the convenience of high-tech services anytime and anywhere. Surface contact cards such as subscriber identity module cards (SIM), compact flash cards (CF) and multimedia cards (MMC) having special circuits are widely used in portable electronic devices to enhance or specialize the functions of the portable electronic devices. For example, a surface contact card is placed in a mobile phone to dedicate the mobile phone's functions to the surface contact card owner. By changing the surface card, a single mobile phone can be used by many different surface contact card owners as a personal phone.

Referring now to FIG. 1, a typical surface contact card holder includes a base 62 made of insulating material and a holding structure 64. The base 62 defines a receiving groove 621 and a card connector 60 comprising a plurality of contacts is set in the middle of the receiving groove 621. The size of the receiving groove 621 is the same as that of a surface card. The holding structure 64 is located adjacent to one end of the receiving groove 621 and can be moved back and forth along the direction as indicated by the arrow shown in FIG. 1.

In use, firstly, the holding structure 64 is moved away from the receiving groove 621 and a surface contact card is received in the receiving groove 621. Then, the holding structure 64 is moved adjacent to the receiving groove 621 for latching the surface contact card in the receiving groove 621. In the same way, the surface contact card can be released by moving the holding structure 64 away from the receiving groove 621.

In the above surface card holder, the holding structure 64 can be easily moved, if a mobile phone employing such a mechanism for holding a surface contact card drops to the ground, the shock will easily force the holding structure 64 to move off the receiving groove 621. As a result, the surface contact card will not connect well with the card contactor 60 or even be released from the receiving groove 621. Obviously, such a conventional mechanism can not hold the surface contact card steadily in the receiving groove 621.

Therefore, there is a need for a new holding structure, which can hold a surface contact card steadily in a portable electronic device.

SUMMARY OF THE INVENTION

In one embodiment, a surface contact card holder for an electronic device includes a latching portion and an elastic frame. The electronic device has a device body with a receiving groove defined therein for receiving a surface contact card and a card entrance in the receiving groove. The latching portion is located adjacent to the card entrance of the receiving groove and the elastic frame is configured for attaching to the device body. The elastic frame has a first frame end located adjacent to the card entrance, and an opposite second frame end. The second frame end has a pressing portion configured for pressing the surface card against the body. The first frame end and the latching portion are configured for sandwiching the surface card therebetween.

Other advantages and novel features of the present surface contact card holder will become more apparent from the following detailed description when taken in conjunction with the accompanying drawings.

BRIEF DESCRIPTION OF THE DRAWINGS

Many aspects of a surface contact card holder can be better understood with reference to the following drawings. The components in the drawings are not necessarily drawn to scale, the emphasis instead being placed upon clearly illustrating the principles of the present surface contact card holder. Moreover, in the drawings, like reference numerals designate corresponding parts throughout the several views.

DETAILED DESCRIPTION OF THE EMBODIMENTS

Figure 1:
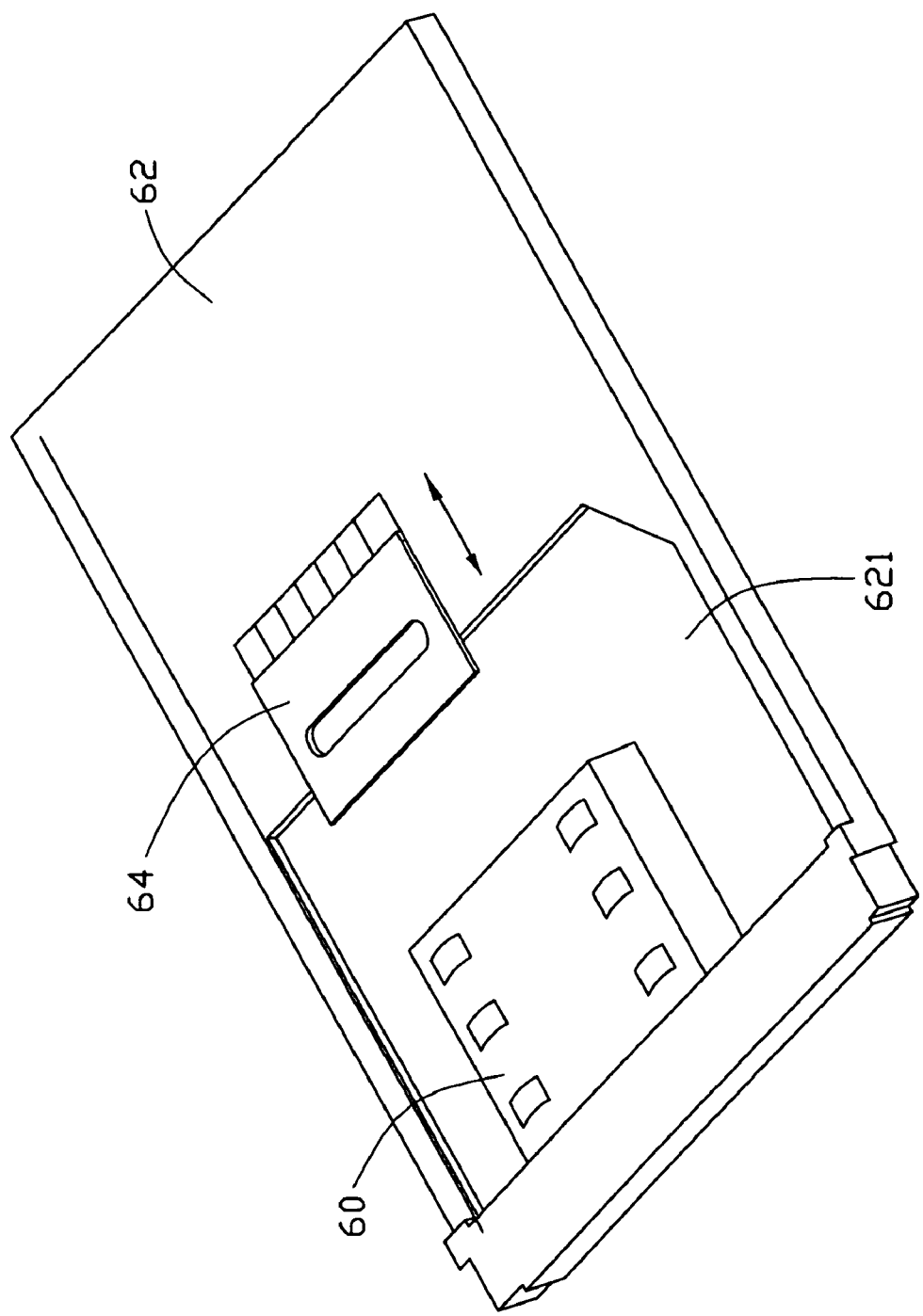
FIG. 1 is an isometric view of a typical surface contact card holder.
Figure 2:
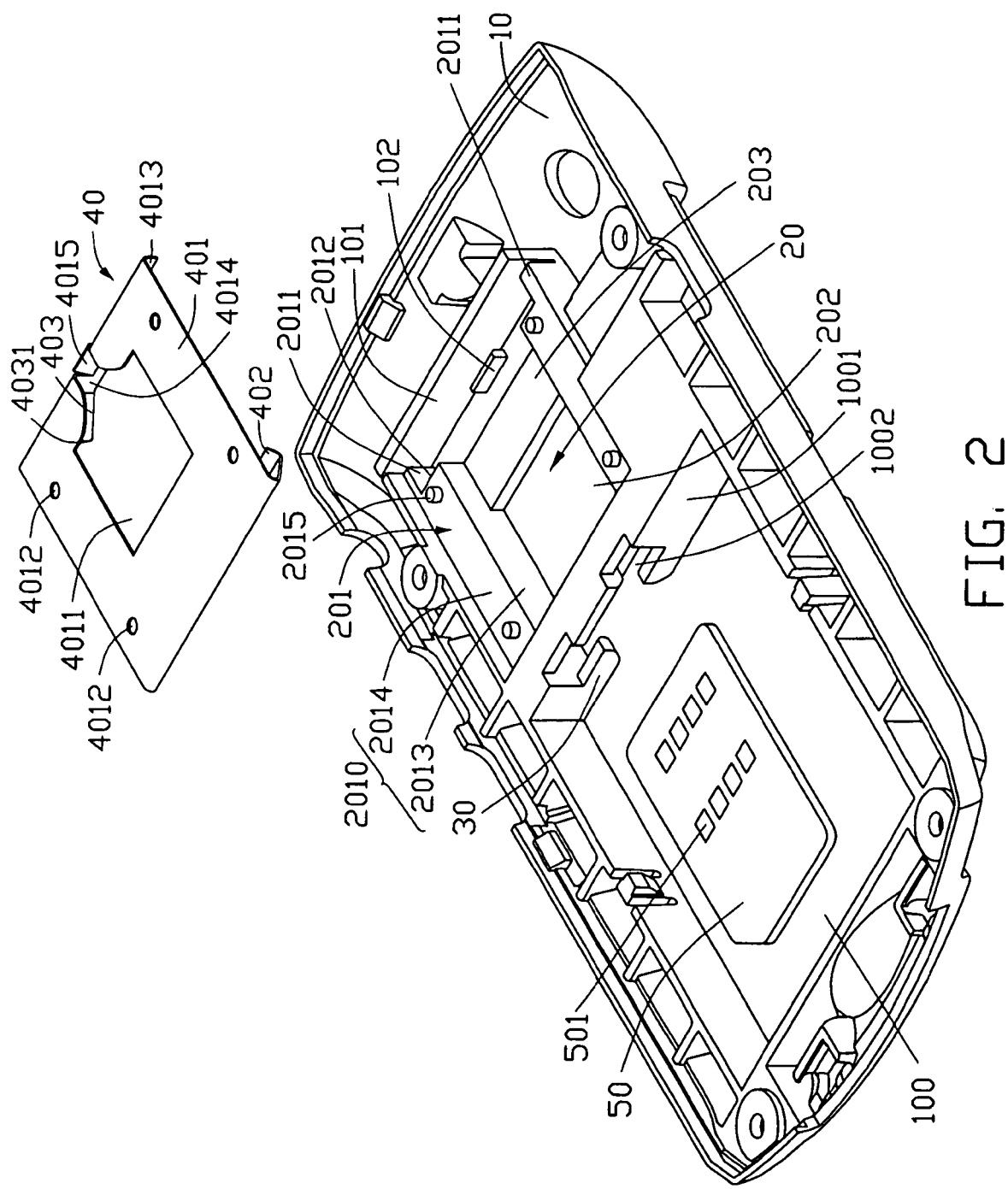
FIG. 2 is an exploded, isometric view of a surface contact card holder, in accordance with a preferred embodiment of the present invention.

Referring now to FIG. 2, in a preferred embodiment, a holding structure 200 for a portable electronic device includes a device body 10 defining a receiving groove 20, a latching portion 30 extending from the device body 10 at one end of the receiving groove 20, and an elastic frame 40.

The device body 10 defines a receiving cavity 100 in one end for receiving a battery (not shown). The device body 10 has a side plate 1001 configured adjacent to the receiving cavity 100. The side plate 1001 defines a rectangular card entrance 1002 communicating with the receiving groove 20. The latching portion 30 includes two blocks adjacent to the card entrance 1002, extending from the side plate 1001.

Figure 5:
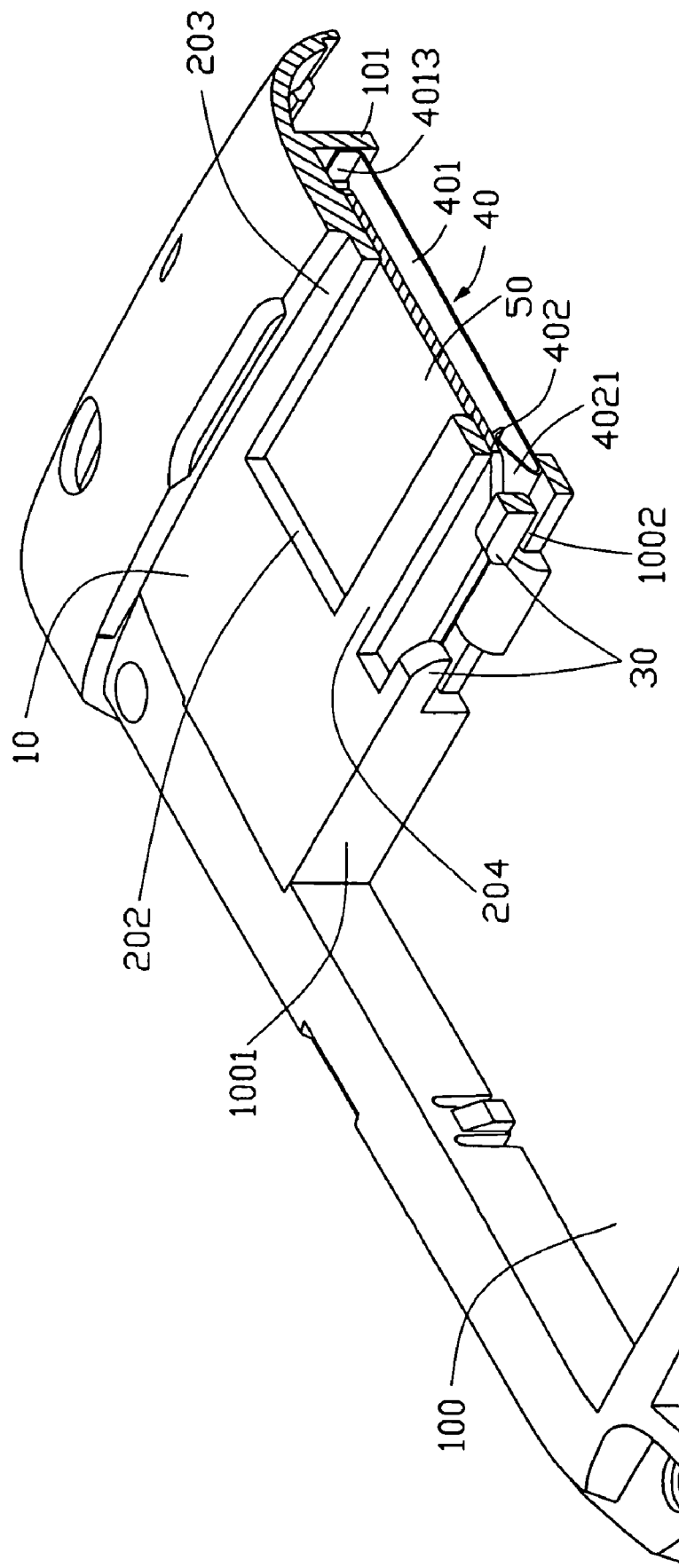
FIG. 5 is a cross-sectional view of FIG. 4, but showing the assembly inverted.

The receiving groove 20 is defined in the device body 10 adjacent to the side plate 1001 for receiving a surface contact card 50 such as a subscriber identity module card (SIM), compact flash card (CF) and multimedia card (MMC) therein, and a size of the receiving groove 20 corresponds to the contact card 50. The surface contact card 50 has a card contactor 501 thereof. Two parallel protruding portions 201 protrude perpendicularly from the side plate 1001, defining the receiving groove 20 therebetween. The two protruding portions 201 are separated from each other at a distance essentially equal to a width of the surface contact card 50. Each protruding portion 201 has a main portion 2010, and an extending portion 2011 connecting to one end of the main portion 2010. The extending portion 2011 is narrower than the main portion, thus forming a step portion 2012 at a junction of the main portion and the extending portion 2011. The main portion 2010 includes a side wall 2013 and a top wall 2014 perpendicular to the side wall 2013. The top wall 2014 has two ends and each end has a cylindrical pole 2015 extending perpendicularly from the top wall 2014. A block plate 101 parallel to the side plate 1001 extends from the device body 10 adjacent to one end of the receiving groove 20. The block plate 101 is rectangular in shape. The block plate 101 is spaced from an end of the extending portion 2011 so as to produce a gap (not labelled) between the block plate 101 and extending portion 2011. A stop piece 102 smaller than the block plate 101 extends from the device body 10 adjacent to one end of the receiving groove 20 and is parallel to the block plate 101. The stop piece 102 is also spaced from the block plate 101 so as to produce a gap (not labelled) between the stop piece 102 and the block plate 101. Referring also to FIG. 5, the device body 10 has a first holding board 203 adjacent to the side plate 1001 and a second holding board 204 adjacent to the stop piece 102 for holding the surface contact card 50. The first holding board 203 and the second holding board 204 are separated by a rectangular hole 202.

Figure 3:
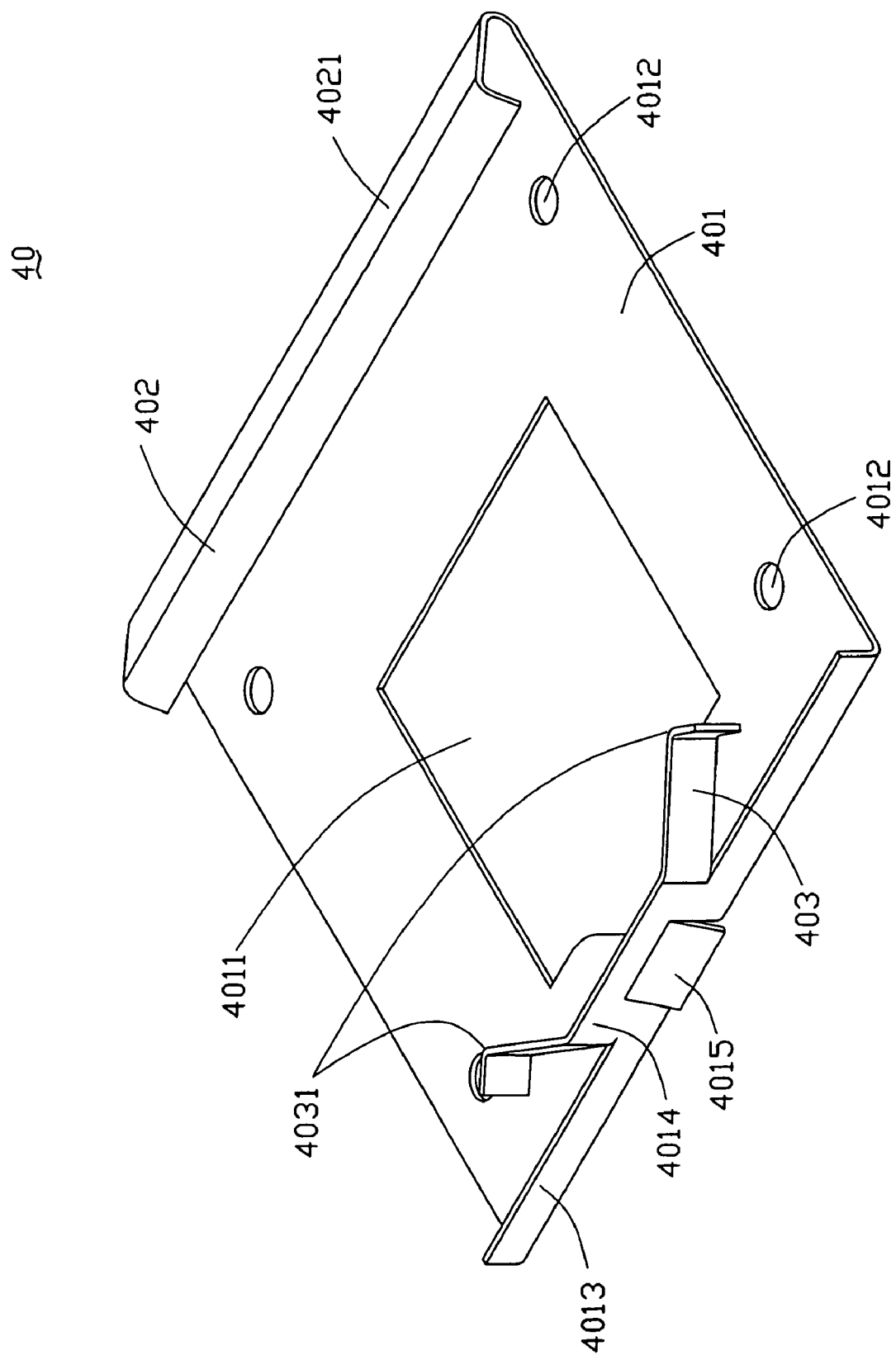
FIG. 3 is an isometric view of an elastic frame of the surface contact card holder in FIG. 2.

Referring also to FIG. 3, the elastic frame 40 is made of, for example, metallic material or plastic material and can be attached to the two protruding portions 201 of the device body 10. The elastic frame 40 has a base plate 401, which defines a rectangular opening 4011 corresponding to the card contactor 501 of the surface contact card 50. The base plate 40 also defines a pair of mounting holes 4012 adjacent to each side of the rectangular opening 4011 for engaging with the cylindrical poles 2015 of the protruding portion 201. A first frame end 402 having a slanted guiding surface 4021 is configured at one end of the elastic frame 40 by bending part of the elastic frame 40, and a second frame end 4013 is configured at an opposite end of the elastic frame 40 by perpendicularly bending part of the elastic frame 40. The second frame end 4013 includes a protruding wall 4014 and two elastic arms 403 extend from the protruding wall 4014 towards the rectangular opening 4011. Each elastic arm 403 forms a pressing portion 4031 by bending an end part of the elastic arm 403. An elastic piece 4015 aslant extends from the middle of the protruding wall 4014.

Figure 4:
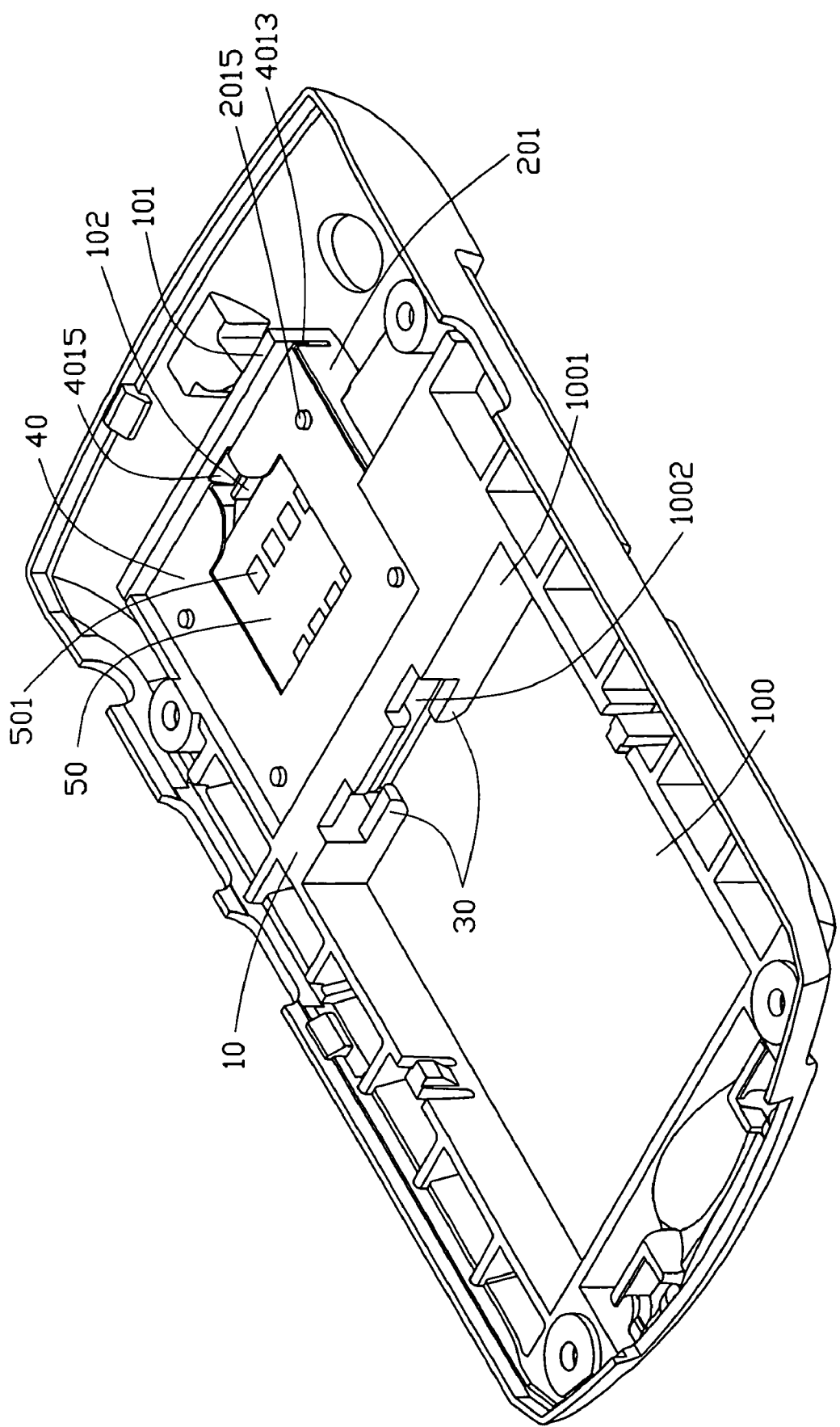
FIG. 4 is an assembled view of holding structure, but showing a surface contact card assembled in the surface contact card holder.

Referring to FIGS. 4-5, in assembly, firstly, the cylindrical poles 2015 of the protruding portion 201 are aimed at their corresponding mounting holes 4012 of the elastic frame 40, with the first frame end 402 of the elastic frame 40 facing towards the top wall 2014 of the protruding portion 201. The elastic frame 40 is then pressed so that the cylindrical poles 2015 can be inserted through the mounting holes 4012 and the second frame end 4013 of the elastic frame 40 is received in the gaps produced between the stop piece 102, the extending portion 2011 and the block plate 101. The elastic piece 4015 of the elastic frame 40 tightly resists the block plate 101 and the mounting holes 4012 also tightly engage the cylindrical poles 2015, therefore, the elastic frame 40 is firmly fixed to the device body 10. After assembly, the first frame end 402 is higher than the latching portion 30.

In use, during mounting the surface contact card 50 in the receiving groove 20, firstly, the surface contact card 50 is disposed into the rectangular card entrance 1002, then the surface contact card 50 is pushed into the receiving groove 20. In that process, the first frame end 402 of the elastic frame 40 is pressed to deform downwards when the surface contact card 50 resists the slanted guiding surface 4021 of the first frame end 402. When the surface contact card 50 is completely received in the receiving groove 11, the pressing portion 4031 of the elastic arm 403 is compressed to extend elastically into the step portion 2012 of the protruding portion 201, and the first frame end 402 released thus rebounding the first frame end 402 back to its original position so that the surface contact card 50 moves upwards until the surface contact card 50 resists the first holding board 203 and the second holding board 204. Due to the rebound of the elastic arm 403, one end of surface contact card 50 abuts against the latching portion 30, so that the latching portion 30 stops the surface contact card 50 from moving out of the receiving groove 20 along an axis parallel to the first holding board 203 and the second holding board 204. Therefore, the holding structure 200 holds the surface contact card 50 steadily by the latching portion 30 and the elastic frame 40.

To remove the surface contact card 50, from the rectangular hole 202, the surface contact card 50 is manually pressed downward until the latching portion 30 disengages from the surface contact card 50. The surface contact card 50 is then made ready to be taken out by the rebounding of the elastic arm 403, the elastic arm 403 then returns to its original position.

In an alternate embodiment, the stop piece 102 and the extending portion 2011 can be omitted. According to this embodiment, the elastic frame 40 is fixed to the device body 10 only by the mounting holes 4012 tightly engaging with the cylindrical poles 2015. The second frame end 4013 of the elastic frame 40 can also be omitted and the two elastic arms 403 can extend directly from the base plate 401. In addition, the hole 202 may be of a shape other than rectangular.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

We claim:

1. A surface contact card holder for an electronic device having a device body with a receiving groove defined therein, the receiving groove being configured for receiving a surface contact card therein and having a card entrance, the holder comprising:

a latching portion located adjacent to the card entrance of the receiving groove; and an elastic frame configured for attaching to the device body, the elastic frame having a first frame end located adjacent the card entrance, and an opposite second frame end, the second frame end having a pressing portion configured for pressing the surface card against the body, the first frame end and the latching portion being configured for sandwiching the surface card therebetween.

2. The surface contact card holder as claimed in claim 1, wherein the device body defines a receiving cavity in one end thereof, and a side plate defining the card entrance is configured adjacent to the receiving cavity.

3. The surface contact card holder as claimed in claim 2, wherein the latching portion includes two blocks adjacent to the card entrance, extending from the side plate.

4. The surface contact card holder as claimed in claim 2, wherein the receiving groove is defined in the body adjacent to the side plate and communicates with the card entrance.

5. The surface contact card holder as claimed in claim 2, wherein the surface contact card is one of a subscriber identity module card, compact flash card and multimedia card.

6. The surface contact card holder as claimed in claim 2, wherein two parallel protruding portions protrude perpendicularly from the side plate, defining the receiving groove therebetween, and the two protruding portions are separated from each other at a distance essentially equal to a width of the surface contact card.

7. The surface contact card holder as claimed in claim 6, wherein each protruding portion has a top wall with a pole extending therefrom, the elastic frame has a base plate defining a mounting hole receiving each pole.

8. The surface contact card holder as claimed in claim 6, wherein each protruding portion has a main portion, and an extending portion connecting to one end of the main portion, and the extending portion is narrower than the main portion so as to form a step portion at a junction of the main portion and the extending portion.

9. The surface contact card holder as claimed in claim 8, wherein a block plate parallel to the side plate being spaced from one end of the extending portion extends from the body adjacent to one end of the receiving groove, a stop piece parallel to the block plate extends from the device body, and the second frame end is fixed between the stop piece, the extending portion and the block plate.

10. The surface contact card holder as claimed in claim 9, wherein the body has a first holding board adjacent to the side plate and a second holding board adjacent to the stop piece for holding the surface contact card, the second frame end includes a protruding wall and two elastic arms extending from the protruding wall towards the first frame end, each elastic arm forms a pressing portion by bending an end part of the elastic arm.

11. The surface contact card holder as claimed in claim 10, wherein the first holding board and the second holding board are separated by a rectangular hole.

12. The surface contact card holder as claimed in claim 1, the surface contact card has a card contactor and the elastic frame defines a rectangular hole corresponding to the card contactor.

13. A portable electronic device comprising:
a device body defining a receiving groove configured for receiving a surface contact card therein;
at least one block extending from the body at one end of the receiving groove for stopping the surface contact card from moving out of the receiving groove; and
an elastic frame fixed with the body, the elastic frame having a first frame end located adjacent the at least one block, and an opposite second frame end, the second frame end having a pressing portion configured for pressing the surface card against the body, the first frame end and the at least one block being configured for sandwiching the surface card therebetween.

14. The portable electronic device as claimed in claim 13, wherein the device body has a side plate adjacent to the receiving groove and the side plate defines a card entrance communicating with the receiving groove.

15. The portable electronic device as claimed in claim 14, wherein two parallel protruding portions protrude perpendicularly from the side plate, defining the receiving groove therebetween, and the two protruding portions are separated from each other at a distance essentially equal to a width of the surface contact card.

16. The portable electronic device as claimed in claim 15, wherein each protruding portion has a main portion, and an extending portion connecting to one end of the main portion, the main portion has a top wall with two ends and a cylindrical pole extending perpendicularly from each end of the top wall, and the elastic frame has a base plate defining a pair of mounting holes for engaging the cylindrical poles.

17. The portable electronic device as claimed in claim 16, wherein a block plate parallel to the side plate being spaced from the extending portion extends from the device body adjacent to one end of the receiving groove, and a stop piece parallel to the block plate extends from the device body, and the second frame end is fixed between the stop piece, the extending portion and the block plate.

18. The portable electronic device as claimed in claim 17, wherein the device body has a first holding board adjacent to the side plate and a second holding board adjacent to the stop piece for holding the surface contact card, the second frame end includes a protruding wall and two elastic arms extending from the protruding wall towards the first frame end, each elastic arm forms the pressing portion by bending an end part of the elastic arm.

19. The portable electronic device as claimed in claim 13, wherein the pressing portion is elastic so as to resiliently press the surface contact card against the device body.

20. The portion electronic device as claimed in claim 13, wherein the second frame end is elastic so as to resiliently press the surface contact card against the at least one block.

* * * * *